United States Patent [19]

Sivaramakrishnam et al.

[11] Patent Number: 5,958,510
[45] Date of Patent: Sep. 28, 1999

[54] METHOD AND APPARATUS FOR FORMING A THIN POLYMER LAYER ON AN INTEGRATED CIRCUIT STRUCTURE

[75] Inventors: Visweswaren Sivaramakrishnam, Santa Clara; Bang C. Nguyen, Fremont; Gayathri Rao, Santa Clara; Stuardo Robles; Gary L. Fong, both of Sunnyvale; Vicente Lim, Newark; Peter W. Lee, Fremont, all of Calif.

[73] Assignee: Applied Materials, Inc., Santa Clara, Calif.

[21] Appl. No.: 08/583,888

[22] Filed: Jan. 8, 1996

[51] Int. Cl.$^6$ .................................................. C23C 16/00
[52] U.S. Cl. ........................ 427/255.6; 427/488; 118/719; 118/724; 118/725; 118/726; 118/729
[58] Field of Search ..................................... 118/719, 724, 118/725, 726, 729; 427/255.6, 488

[56] References Cited

U.S. PATENT DOCUMENTS

| | | | |
|---|---|---|---|
| 3,895,135 | 7/1975 | Hofer | 427/255.6 |
| 4,500,562 | 2/1985 | Jahn | 427/27 |

(List continued on next page.)

FOREIGN PATENT DOCUMENTS

| | | | |
|---|---|---|---|
| 60-63369 | 4/1985 | Japan | 118/728 |

OTHER PUBLICATIONS

Sharma, Journal of Polymer Science: Part A: Polymer chemistry, vol. 26, 2953–2971 (1988).
Yasuda, Plasma Polymerization, Academic Press, N.Y., ©1985, pp. 65–71.
Jeng, Shin–Puu, et al., "A Planarized Multilevel Interconnect Scheme with Embedded Low–Dielectric–Constant Polymers for Sub–Quarter–Micron Applications", *Publication, J. Vac. Sci + Tech.*, Jun. 1995.
Olson, R., "Xylylene Polymers," *Encyclopedia of Polymer Science and Engineering*, 2nd ed., vol. 17, pp. 990–1025.
Parker, Sybil P., ed., *McGraw–Hill Dictionary of Chemistry*, New York: McGraw–Hill Book Co., 1984, p. 450.
Sax, N. Ivring, et al., *Hawley's Condensed Chemical Dictionary*, revised ed., New York: Van Nostrand Reinhold Co., 1987, p. 876.
Sharma, Ashok K., "Parylene C at Subambient Temperatures", *Journal of Polymer Science: Part A. Polymer Chemistry*, vol. 26, 1988, pp. 2953–2971.

*Primary Examiner*—Richard Bueker
*Attorney, Agent, or Firm*—Thomason, Moser & Patterson

[57] ABSTRACT

A method and apparatus are disclosed for forming thin polymer layers on semiconductor substrates. In one embodiment, the method and apparatus include the sublimation of stable dimer parylene material, the pyrolytic conversion of such gaseous dimer material into reactive monomers, and for the optional blending of the resulting gaseous parylene monomers with one or more polymerizable materials in gaseous form capable of copolymerizing with the parylene monomers to form a low dielectric constant polymerized parylene material. An apparatus is also disclosed which provides for the distribution of the polymerizable gases into the deposition chamber, for cooling the substrate down to a temperature at which the gases will condense to form a polymerized dielectric material, for heating the walls of the deposition chamber to inhibit formation and accumulation of polymerized residues thereon, and for recapturing unreacted monomeric vapors exiting the deposition chamber. An apparatus is further provided downstream of the deposition chamber to control both the flow rate or residence time of the reactive monomer in the deposition chamber as well as to control the pressure of the deposition chamber. Provision is further made for an electrical bias to permit the apparatus to function as a plasma etch chamber, for in situ plasma cleaning of the chamber between depositions, for enhancing cracking of polymerizable precursor material, for heating the walls of the chamber and for providing heat sufficient to prevent polymerization in the gas phase.

43 Claims, 8 Drawing Sheets

5,958,510
Page 2

U.S. PATENT DOCUMENTS

| | | | |
|---|---|---|---|
| 4,556,584 | 12/1985 | Sarkozy | 427/255.3 |
| 4,945,856 | 8/1990 | Stewart | 118/728 |
| 4,951,601 | 8/1990 | Maydan et al. | 118/719 |
| 4,986,216 | 1/1991 | Ohmori | 118/715 |
| 5,079,031 | 1/1992 | Yamazaki | 118/723 E |
| 5,121,706 | 6/1992 | Nichols | 118/719 |
| 5,268,202 | 12/1993 | You | 427/255.6 |
| 5,270,082 | 12/1993 | Lin | 427/255.6 |
| 5,355,832 | 10/1994 | Loh | 118/723 E |
| 5,424,097 | 6/1995 | Olson et al. | 427/255.6 |
| 5,447,570 | 9/1995 | Schmitz | 118/725 |
| 5,491,112 | 2/1996 | Buchta | 118/725 |
| 5,522,933 | 6/1996 | Geller | 118/723 E |
| 5,534,068 | 7/1996 | Beach et al. . | |
| 5,536,317 | 7/1996 | Crain et al. . | |
| 5,536,319 | 7/1996 | Wary | 118/724 |
| 5,536,321 | 7/1996 | Olsen et al. . | |
| 5,536,322 | 7/1996 | Wary et al. . | |
| 5,536,892 | 7/1996 | Dolbier et al. . | |
| 5,538,758 | 7/1996 | Beach et al. . | |
| 5,556,473 | 9/1996 | Olson et al. . | |
| 5,582,866 | 12/1996 | White | 118/725 |
| 5,709,753 | 1/1998 | Olson et al. . | |

METHOD AND APPARATUS FOR FORMING A THIN POLYMER LAYER ON AN INTEGRATED CIRCUIT STRUCTURE

FIELD OF THE INVENTION

This invention relates to a method and apparatus for forming a thin polymer layer on a substrate. More particularly, this invention relates to a method and apparatus for depositing a layer of a polymeric or polymerizable material having a low dielectric constant, such as parylene, on or between metal layers on a substrate containing an integrated circuit structure.

BACKGROUND OF THE INVENTION

In the construction of integrated circuit structures, device geometries are constantly shrinking, resulting in an increase in parasitic capacitance between devices. This includes increases in parasitic capacitance between adjacent metal interconnects, either on the same layer or between adjacent metal interconnect layers, which can result in crosstalk between the metal lines or interconnects and in a reduction of the response time. Lowering the capacitance between metal interconnects separated by dielectric material can be accomplished by either increasing the thickness of the dielectric material or by lowering the dielectric constant of the dielectric material. Increasing the thickness of the dielectric materials is, however, contrary to the goal of reducing device and structure geometries.

As a result, to reduce the parasitic capacitance between metal interconnects on the same or adjacent layers, one must change the material used between the metal lines or interconnects to a material having a lower dielectric constant than the materials currently used, i.e., silicon dioxide ($SiO_2$).

Jeng et al. in "A Planarized Multilevel Interconnect Scheme with Embedded Low-Dielectric-Constant Polymers for Sub-Quarter-Micron Applications", published in the Journal of Vacuum and Technology in June 1995, discuss the use of a low dielectric constant polymeric material, such as parylene, as a substitute for silicon dioxide ($SiO_2$) between tightly spaced conductor lines or other strategically important areas of an integrated circuit structure.

Parylene, a generic name for thermoplastic polymers based on p-xylylene monomers, has been shown to possess suitable physical, chemical, electrical, and thermal properties. Formation and deposition of such polymers by the initial decomposition of a stable dimer, followed by deposition and polymerization of the resulting reactive monomer, is discussed by Ashok K. Sharma in "Parylene-C at Sub-ambient Temperatures", published in the Journal of Polymer Science: Part A: Polymer Chemistry, Vol. 26, at pages 2953–2971 (1988). Properties of such polymeric materials, including their low dielectric constants, are further discussed by R. Olson in "Xylylene Polymers", published in the Encyclopedia of Polymer Science and Engineering, Volume 17, Second Edition, at pages 990–1024 (1989).

However, changing the dielectric material in the construction of integrated circuit structures from conventional silicon dioxide ($SiO_2$) to polymeric materials cannot be accomplished using conventional methods and apparatus used to form $SiO_2$ dielectric materials between adjacent metal lines or interconnects on a single layer or between adjacent layers of metal interconnects.

SUMMARY OF THE INVENTION

The present invention provides a computer controlled method and apparatus for forming a polymer layer between metal interconnects and between layers of metal interconnects on a substrate. In particular, an apparatus and method is provided for the processing of polymeric or polymerizable material preferably having a dielectric constant lower than that of silicon dioxide. In one embodiment, where the polymeric material is parylene, the method and apparatus provide for continuous introduction of reactive monomer into a processing chamber, such as a CVD or plasma etch chamber, and condensation of the reactive monomer onto a workpiece to form a polymer layer thereon. The apparatus generally comprises a chamber having a gas inlet for providing reactive material into the chamber, a gas outlet for exhausting the chamber and controlling the pressure within the chamber and a movable substrate support member disposed in the lower portion of the chamber to position a substrate relative to the gas inlet. The chamber preferably includes a DC bias to provide an E filed which is believed to enhance the deposition rate of the polymer and a RF bias to facilitate generation of a plasma to assist in thermal cracking of the polymerizable material, and to enable the chamber to be utilized in etching and other fabrication processes. A magnet assembly provides a B field within the chamber which is also believed to enhance the deposition rate of the polymerizable material.

In another embodiment, the method and apparatus provide for vaporization or sublimation of stable precursors, such as the stable dimer of xylylene or parylene material, and, when appropriate, the pyrolytic conversion of such stable precursors into more reactive materials, such as the conversion of the sublimed dimer parylene material into a reactive monomer. A heated pressure gauge is located in the vaporization chamber to monitor the pressure within the chamber and enable continuous delivery of the polymerizable material into the chamber to be vaporized.

In another embodiment, a method and apparatus is also provided for the optional blending of the reactive polymeric or polymerizable material, such as reactive parylene monomer, with material capable of reacting with the polymeric or polymerizable material to form a copolymer.

An apparatus and method is further provided for the distribution of the polymerizable gases into the deposition chamber, for cooling the substrate down to an acceptable deposition temperature, for heating the walls of the deposition chamber to inhibit accumulation of residues thereon, for controlling the pressure and residence time of the gaseous reactants in the chamber. The apparatus and method may further provide for recapturing undeposited vapors, such as unreacted monomeric vapors, exiting the deposition chamber.

The apparatus may be incorporated into a computer controlled multi-chamber integrated processing system wherein etching of the substrate and in situ plasma cleaning can be accomplished in the same deposition chamber. The RF bias provided in the chamber enables in situ plasma cleaning, enhanced thermal cracking of the precursor polymerizable material provided in the chamber, enhanced heating of the chamber walls, and reduces the degree of polymerization occurring in the gas phase.

DETAILED DESCRIPTION OF THE INVENTION

The present invention generally comprises a method and apparatus for forming thin polymer films on the surface of a workpiece. A multi-purpose processing chamber is provided wherein vapor deposition of a polymer onto a substrate, plasma etching and in situ plasma cleaning can be accomplished. The method and apparatus of the present invention is computer controlled and can be utilized in a computer controlled multi-chamber integrated processing system.

Generally, an apparatus of the present invention includes a processing chamber, a substrate support member located in the chamber, a gas inlet for providing process gas into the chamber and a gas outlet for exhausting the contents of the chamber. Preferably, the chamber includes both a DC and RF bias for generating an E field within the chamber to enhance the deposition rate of the polymerizable material and a plasma within the chamber to enhance the deposition rate of the polymer, enable plasma etching, in situ chamber cleaning, and enhance thermal cracking of precursor polymerizable materials within the processing chamber. In addition, a magnet system preferably provides a B field which is believed to enhance the deposition rate of the polymerizable material onto the workpiece. It is contemplated by the present invention that a continuous supply of reactive polymerizable material may be provided into the chamber through the gas inlet. An inert carrier gas such as argon may be used to supply the reactive polymerizable material into the chamber. This inert gas and the RF bias may be used to form a plasma within the processing chamber in some applications. These and other aspects of the present invention will be described in detail below.

Where the polymerizable material is parylene, an apparatus and method is provided which enables vaporization and decomposition of a stable precursor material to form the reactive monomer which is then deposited onto the substrate. For illustrative purposes, the method and apparatus of the present invention used in the vapor deposition of parylene is described below. It should be noted that in certain applications the vaporization and decomposition chambers can be eliminated.

An apparatus is provided for the vaporization or sublimation of a polymerizable material, distribution of the polymerizable gases into the deposition chamber, and deposition of the vaporized polymerizable material onto an object or substrate to form a thin polymer film thereon. It is preferred that the apparatus cool the substrate down to a temperature at which the gases will condense to form a polymerized dielectric material thereon, heat the walls of the deposition chamber to inhibit deposition thereon, and recapture unused and undeposited materials, such as unreacted polymerizable vapors exiting the deposition chamber. An apparatus is further provided downstream of the deposition chamber to control both the flow rate or residence time of the polymeric or polymerizable material, such as reactive monomer, in the deposition chamber as well as to control the pressure of the deposition chamber.

The apparatus of the invention may be used in connection with deposition (and etching) on a substrate of any polymeric or polymerizable dielectric material, including, for example, xylylene, parylene, tetrafluoroethylene, polytetrafluoroethylene, naphthalene, or polynaphthalene. It is preferred that the polymer have a dielectric constant lower than silicon dioxide as well as suitable physical, chemical, electrical and thermal properties for use on integrated circuits in accordance with the present invention.

In situations where the polymerizable material is a stable dimer, it is preferred that the apparatus provide for pyrolytic conversion or decomposition of vaporized polymerizable material into reactive monomers, and for the optional blending of the resulting reactive monomer vapor with one or more other vaporized polymerizable materials capable of forming a copolymer. The pyrolytic conversion or decomposition of a dimer may partially occur in a decomposition chamber or in a plasma formed in the processing chamber. In addition, a plasma may be used to enhance decomposition of any dimer exiting a decomposition chamber in its stable form.

Figure 1:
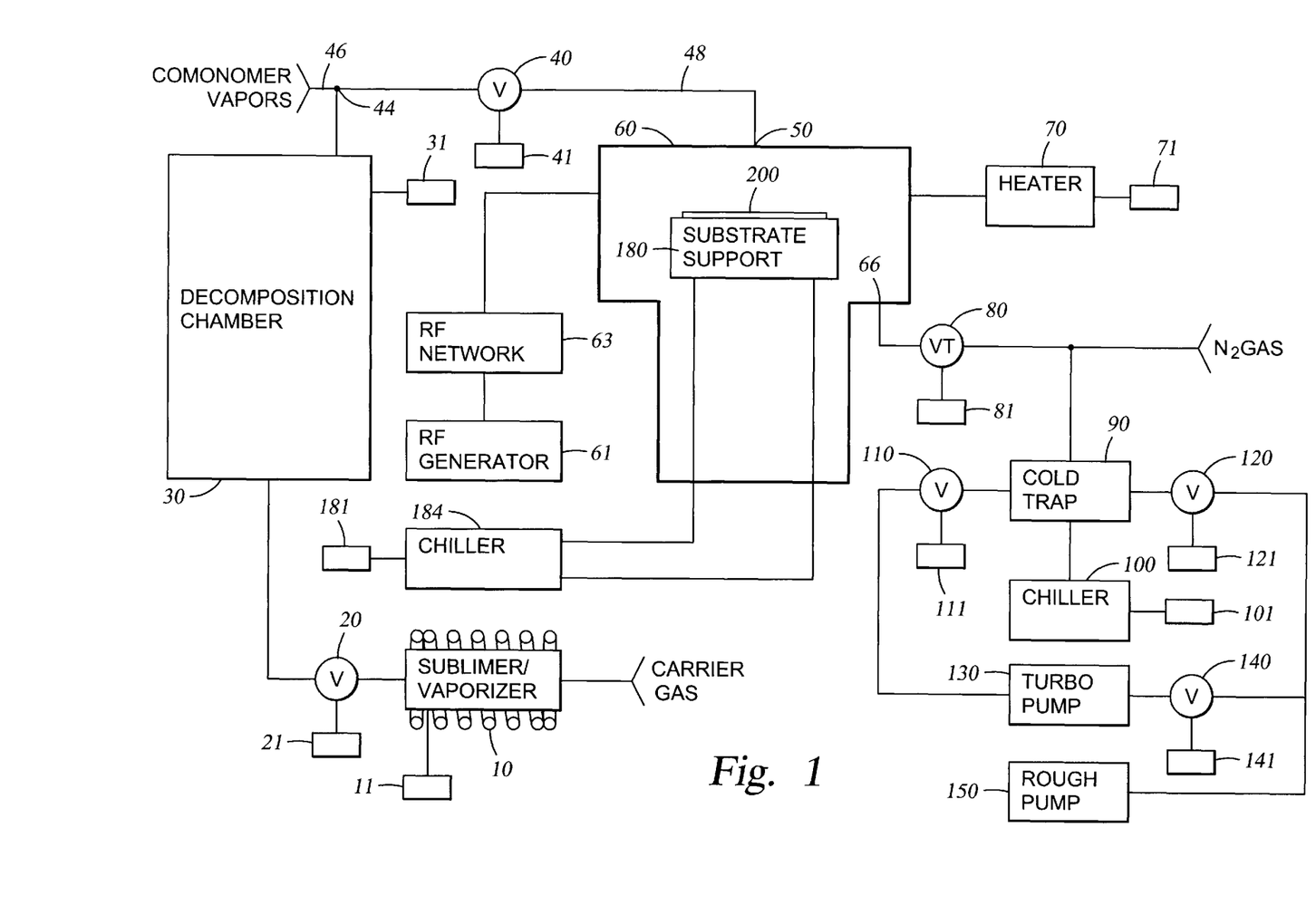
FIG. 1 is a schematic diagram of an apparatus of the present invention.
Figure 1A:
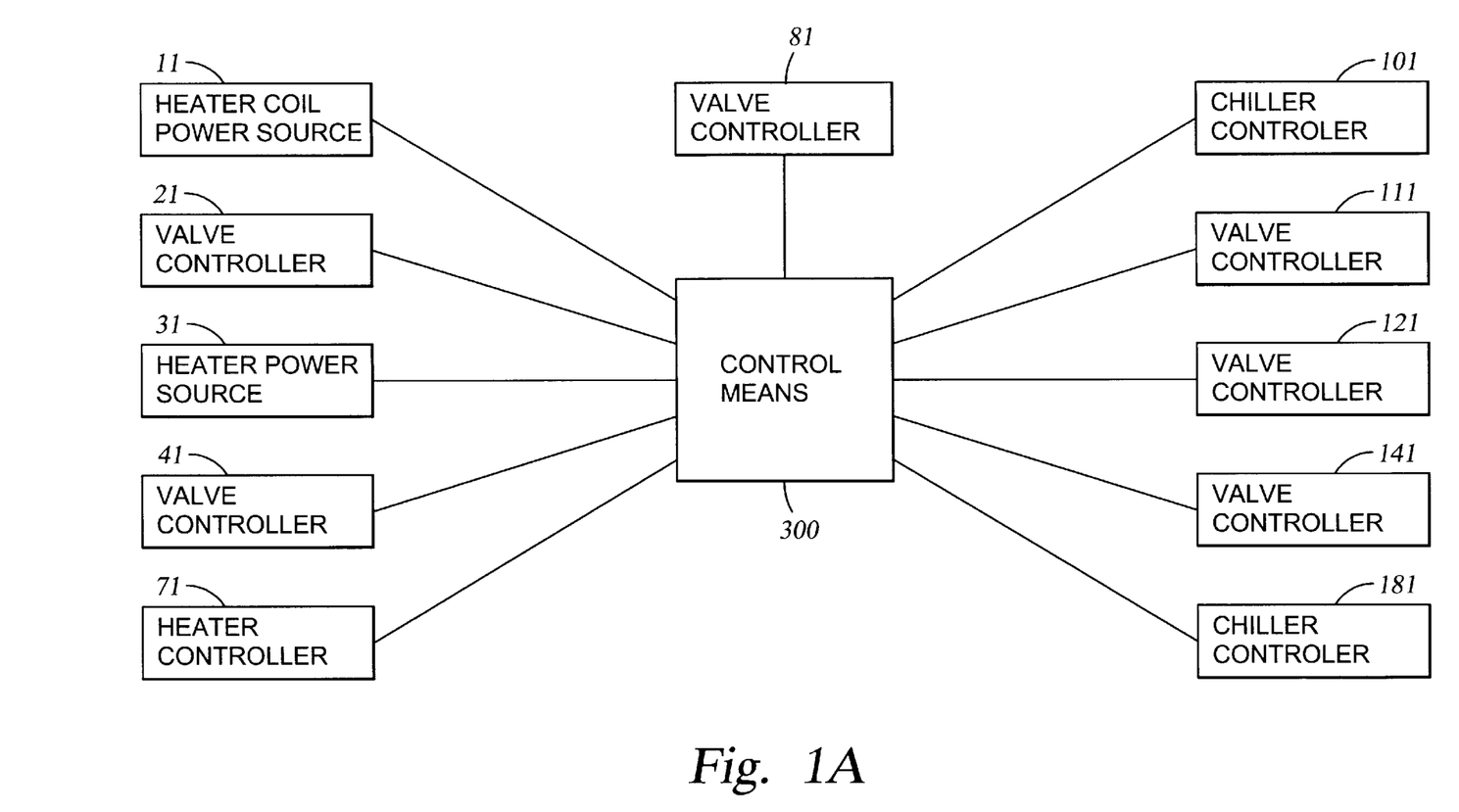

Referring to FIG. 1, in one embodiment, a vaporization chamber or vaporizer, generally indicated at 10, is provided to heat and vaporize or sublime a particulate solid or liquid polymerizable material and to optionally mix the vaporized material with a non-reactive carrier gas. A heated pressure gauge, such as one available from Baratron, is located in the vaporization chamber to monitor the pressure of the chamber and insure that a continuous feed of particulate solid or liquid polymerizable material is provided to the chamber so that a continuous delivery of reactive polymerizable material is introduced into the deposition chamber. The pressure gauge is preferably heated so that the polymerizable material will not deposit on the gauge and render the gauge inoperable. In the situation where the polymerizable material is a stable dimer, the vaporized dimer, such as para-xylylene, or optional mixture of vaporized dimer and carrier gas then passes from vaporization zone 10 through gate valve 20 to a pyrolysis or decomposition chamber 30 where the vaporized dimer is at least partially decomposed to the reactive monomer, such as xylylene. It should be recognized that when the polymerizable material is a monomer or oligomer that does not require vaporization or decomposition to produce a reactive species, then the vaporization and decomposition chambers may be removed or bypassed.

The gas/vapor flow containing the active monomer/oligomer then passes out of decomposition chamber 30 to a tee 44 where the vapors are optionally blended with a copolymerization material in vaporized form from conduit 46 (shown in FIG. 1). The vaporized monomer and optional copolymerizable material then flow through a second gate valve 40 to a conduit 48 which connects valve 40 with an entrance port 50 to a substrate processing chamber 60 where the monomer deposits and polymerizes on an object therein, such as a semiconductor substrate, which is preferably temperature controlled by a support member 180 which is connected to a chiller 184. Where vaporization and/or decomposition of the polymerizable material is not necessary, polymerizable material is introduced at tee 44 for direct communication to the chamber 60 and the vaporizer 10 and decomposition chamber 30 may be eliminated.

It is preferred that the walls of chamber 60 be maintained at a sufficiently high temperature to prevent deposition and polymerization of the vaporized polymerizable material. In one embodiment, the chamber wall temperature is maintained by a heater 70, under the control of heater controller 71. The remaining gas/vapor mixture then passes from deposition chamber 60 through a throttle valve 80, under the control of valve controller 81, which regulates the pressure in chamber 60, and then passes through a cold trap 90 connected to a chiller 100. The remaining gases then pass through a gate valve 120, controlled by valve controller 121, to a rough pump 150. It is anticipated that the chamber walls may be heated by any other heating means, including the use of a plasma generated within the chamber itself.

When it is desired to use chamber 60 for etching or when in situ cleaning of chamber 60 is performed, the gases from optional cold trap 90 may instead be routed through gate valve 110 (with gate valve 120 shut off), controlled by valve controller 111, to turbo pump 130 and then through isolation valve 140, controlled by valve controller 141, to rough pump 150. During deposition in chamber 60, valves 110 and 140 are typically shut.

In one embodiment, the apparatus may be provided with an RF generator 61 which is coupled to chamber 60 through an RF network 63 to permit generation of a plasma within chamber 60. The plasma may be used to enhance the decomposition of stable precursors by generating enough heat to convert the stable dimer into the reactive species. The plasma may also provide sufficient heating of the chamber walls to prevent polymerization thereon and/or sufficient heating of the process gases to prevent polymerization in the gas phase. In addition, the RF generator enables integration of the chamber so that either etching of the substrate or in situ cleaning of chamber 60 can be performed.

It is contemplated that the chamber may include an electric bias to provide an electric field to enhance the deposition rate of the polymerizable material onto the substrate. Preferably, the chamber walls are grounded and a DC bias is applied to the substrate support member. In addition to the electric field, a B field may be created in the chamber by placement of magnetic field coils or permanent magnets within or about the walls of the chamber. It is also believed that both the E field and the B field enhance the deposition rate of the polymerizable material onto the substrate because the reactive polymerizable material may be polarized. It is theorized that the E field and/or the B field assist in the polymerization process by aligning the reactive material so that the polymerization reaction is facilitated.

It should be noted that, in accordance with the invention, the substrate is preferably processed in a closed system. Thus, after the deposition, the substrate may be removed from the deposition chamber, placed in a storage area in the load lock chamber between processing chambers, and allowed to reach ambient temperature. This permits the substrate to reach ambient temperature without either exposing the substrate to the ambient atmosphere during the warmup (which would result in unacceptable moisture pickup), or leaving the coated substrate in the deposition chamber to warm up (which would reduce the throughput rate in the parylene deposition chamber). Alternatively, the substrate may be moved from the load lock chamber to other chambers for subsequent processing without removing the substrate from the vacuum environment, e.g., moved to another chamber for PECVD formation of a silicon dioxide ($SiO_2$) film thereon. It is further contemplated by the present invention that a substrate may receive deposition of multiple layers thereon or blanket etch of layers formed thereon within the same chamber or in multiple chambers without ever breaking vacuum.

A preferred polymer for use in integrated circuits, according to the present invention, is parylene. As used herein, the term "parylene" is the generic name for thermoplastic monomers, dimers, and polymers based on para-xylylene or p-xylylene ($CH_2C_6H_4CH_2$) which have the formula $CH_3C_6H_4CH_3$ (for monomeric parylene, known as para-xylene), $(CH_2C_6H_4CH_2)_2$ (for the stable cyclic parylene dimer), or the repeating structure of the following formula (for the parylene polymer):

(parylene polymer) $CH_3C_6H_4CH_2$—$(CH_2C_6H_4CH_2$—$)_n$-$CH_2C_6H_4CH_3$ where $n \geq 0$.

The term "parylene" is also intended to cover chlorinated or fluorinated forms of p-xylylene materials, i.e., mono-, di-, tri-, and tetrachloro p-xylylene monomers, dimers, and polymers; or mono-, di-, tri-, and tetrafluoro p-xylylene monomers, dimers, and polymers. Since the parylene starting material, comprising the stable cyclic dimer di-p-xylyene, is in solid form, the solid parylene dimer must be vaporized or sublimed, and then decomposed to the reactive monomeric form before being introduced into the deposition chamber. The solid parylene dimer is a commercially available product available from companies such as Union Carbide. Usually the solid parylene dimer starting material is in particulated form, e.g., in powder form, for ease of handling. However, it is contemplated by the present invention that parylene dimer pellets may be used in conjunction with a packed bed or that the solid precursor material may be liquefied or dissolved in a carrier fluid to facilitate continuous delivery of the precursor material into the vaporization chamber.

Figure 2:
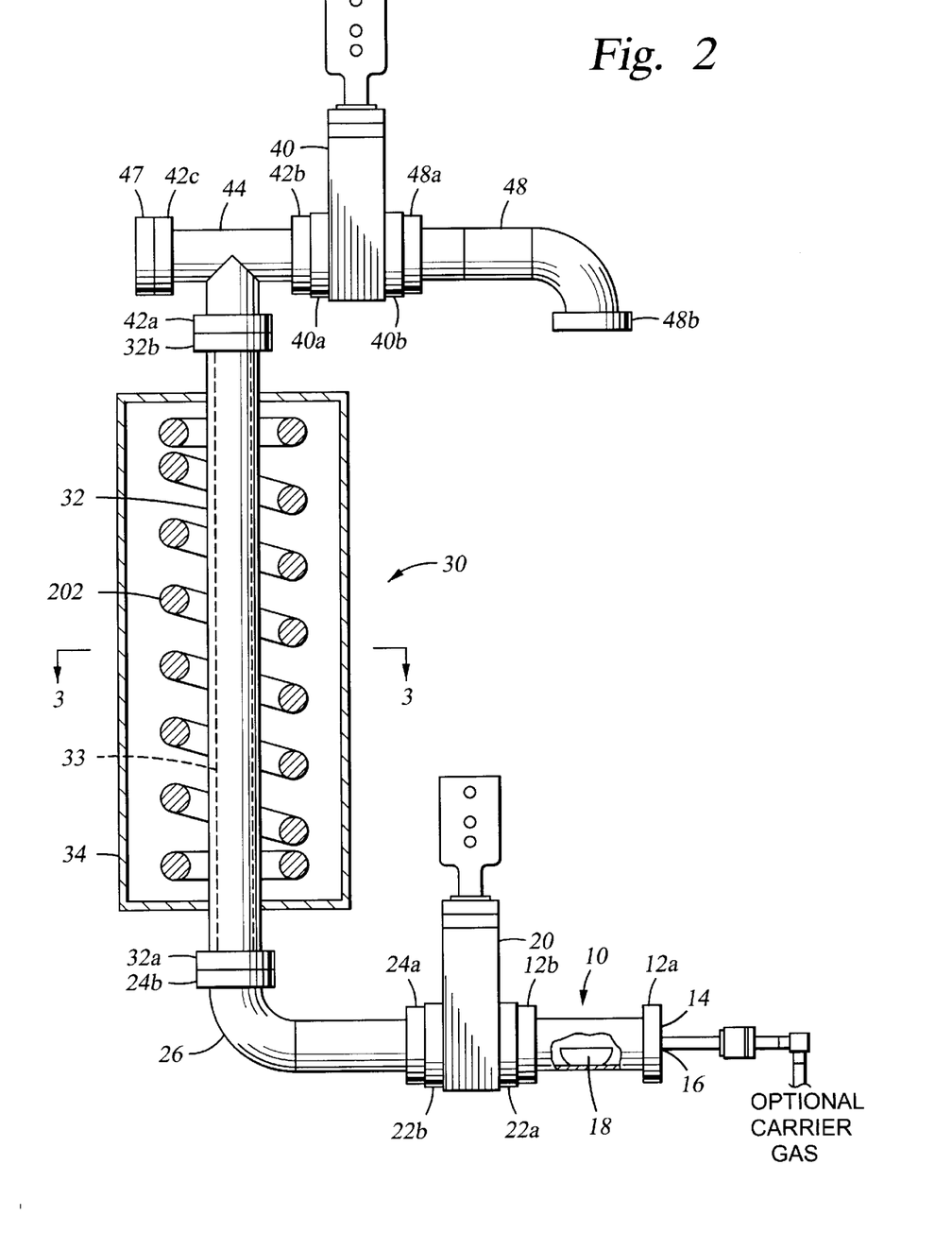
FIG. 2 is a partially sectioned view of a portion of the apparatus of FIG. 1, showing the sublimation/vaporization chamber, the decomposition chamber, and the manifold for feeding the vapors into the deposition chamber.

Referring now to FIGS. 1 and 2, one embodiment of a vaporization chamber or vaporizer 10 is shown heating the starting material to vaporize or sublime a liquid or solid polymerizable material before introducing it into the deposition chamber or blending it with another monomer. The vaporization chamber and valve assembly are designed to enable loading of the parylene precursor into the vaporization chamber without stopping the deposition process. An auto flow controller may be located on the output side of either the vaporization chamber or the decomposition chamber to monitor the output or delivery of vaporized dimer or reactive monomer and facilitate loading of the vaporization chamber by enabling flow control of the material through the system and into the deposition chamber. Vaporization chamber 10 may comprise a metal cylinder comprising stainless steel or aluminum, having metal flanges 12a and 12b thereon. Metal flange 12a has a cover 14 thereon which is provided with a gas inlet port 16 to permit the flow of a non-reactive gas into vaporization chamber 10, as will be described below. Flange 12b, which comprises the exit port of chamber 10, is bolted to a matching flange 22a of gate valve 20 which separates vaporization/sublimation chamber 10 from decomposition chamber 30, as will be described below.

Within vaporization chamber 10, as shown in FIG. 2, is a containment vessel 18 for placement of polymerizable starting material, such as particulate parylene dimer. Containment vessel 18, which may rest on the inner surface of vaporization chamber 10, is made of a non-reactive material, usually a ceramic material, and preferably comprises quartz.

As an option, containment vessel 18 may be further provided with a number of openings (not shown) in the upper half of the vessel to facilitate flow of heated gases into and out of containment vessel 18 to assist in the vaporization of the solid parylene dimer and entrainment of the dimer vapors in the carrier gas flow.

The pressure in vaporization chamber 10 may be maintained at atmospheric pressure. The entire apparatus (vaporization, decomposition, and deposition chambers) is preferably maintained at the same pressure. Preferably, the pressure is no higher than about 1 Torr, and may be as low as 30 milliTorr. Most preferably, the pressure will range from about 100 milliTorr to about 1 Torr or about 20–60 milliTorr above the base pressure which is preferably in the range of 80–120 milliTorr.

Vaporization/sublimation chamber 10 may be heated by any convenient means such as, for example, a heating coil 200 which may be wrapped around metal chamber 10 to heat the same. The heating coil, in turn, is connected to an external electrical power source 11, which is adjustable to provide sufficient heat to chamber 10 to heat it to the vaporization temperature of the polymerizable material therein, but below a temperature at which the material will decompose into the reactive monomer. An external heat controller, such as a Watlow 965 Temperature Controller, may be used in connection with the heating coil to maintain the desired temperature.

The temperature of vaporization/sublimation chamber 10, when operated within the previously described pressure ranges, will usually vary from a minimum temperature below which the material will not vaporize, at the pressure required for deposition, up to a maximum temperature below the temperature at which the vaporized material will decompose, at the operative pressure. While the operating temperature of the vaporizer will vary according to the material to be vaporized, the temperature is preferably maintained between about 100° C. and about 200° C. The use of other pressures in chamber 10 will result in a need to change the temperature range accordingly. For example, when the parylene dimer is used at a pressure ranging from about 100 milliTorr to about 1 Torr, the temperature in the vaporizer should range from about 120° C. to about 200° C.

Non-reactive gases, such as nitrogen, argon, or helium are optionally flown into chamber 10, through gas inlet port 16 in cover 14, and are then heated by the heat radiating or being conducted from heated chamber 10 to thereby vaporize the solid parylene dimer which then leaves chamber 10 and passes through gate valve 20 to decomposition chamber 30. However, it should be recognized that the process may be carried out using only the vaporized reactant, e.g., parylene dimer, without the use of an additional gas such as a carrier gas.

A first valve 20 may be manually operated, but preferably will be automatically operated and connected to a control mechanism 21 which will sense the temperature and pressure in vaporization chamber 10 and open valve 20 only after vaporization chamber 10 has reached a temperature at which the polymerizable material will vaporize so that gases flowing from vaporization chamber 10 through the first valve 20 will contain vaporized polymerizable material, as well as the optional non-reactive carrier gases flowing through vaporization chamber 10. A second flange, 22b, connects first valve 20 to a first flange 24a on a conduit 26 having a second flange 24b at its opposite end connected to a first flange 32a of decomposition chamber 30.

Flanged metal conduit 26, is preferably heated by an external heater such as heating tape wrapped around conduit 26 to maintain the reactive monomer at a temperature sufficiently high so that it will not begin to polymerize. Typically, this will be a temperature of at least about 120° C.

When decomposition of the vaporized polymerizable starting material is necessary to form a reactive monomer, such as when using a parylene dimer, the vapors from the vaporization chamber are sent to a decomposition chamber. While the decomposition chamber may be constructed in many ways, it is preferred that the chamber have a large surface area to heat the vaporized material rapidly and evenly.

In one embodiment, the decomposition chamber 30 comprises a metal cylinder wall 32 terminating, at one end, in first flange 32a through which it is connected, via conduit 26, to first gate valve 20, which is used to control the flow of the vapors of reactive parylene monomer exiting decomposition chamber 30. The inner surface of metal cylinder 32 may be optionally lined with quartz, as shown at 33, to avoid contamination of the reactive parylene monomer vapors at the temperature used to decompose the dimer.

Surrounding metal cylinder 32 is a cylindrical ceramic furnace 34, having heater wires 202 embedded therein to heat cylinder 32. An outer layer of perforated metal 204 may optionally surround ceramic furnace 34 to serve both as a shield to avoid contact, by the operator, with the hot ceramic furnace, as well as to permit the flow of air between the metal shield and ceramic furnace 34.

The heater wires of the ceramic furnace 34 are connected to an external power supply and temperature controller 31 to maintain decomposition chamber 30, defined by metal cylinder wall 32 at a temperature of between about 400° C. and about 800° C., preferably at least about 600° C. A temperature of at least about 400° C. and preferably at least about 600° C., is necessary to assure sufficient decomposition of the stable parylene dimer into the reactive monomer, while the maximum temperature should not exceed about 750° C. to avoid decomposition of the monomer formed in decomposition chamber 30. It should again be recognized that the decomposition temperature will vary according to the dimer material being used.

It is preferred that the decomposition chamber 30 decompose a sufficient amount of the dimer during its passage through cylinder 32 to form the reactive monomer to prevent the deposition of unwanted particles on the substrate surface or the formation of lumps in the deposited coating. Dimer that has not been decomposed will not polymerize with the reactive monomer, and may, therefore, cause lumps in the coating as it deposits on the substrate, cause unwanted particles on the surface, or pass through the deposition chamber and clog the cold trap mechanism 90 located downstream of deposition chamber 60 ahead of rough vacuum pump 150.

It should be noted that the use of first gate valve 20 and second gate valve 40, both preferably computer controlled, allows both vaporization chamber 10 and decomposition chamber 30 to be isolated from deposition chamber 60 while the substrate is removed from the deposition chamber. That is, the whole system need not be shut down during movement of a substrate into the deposition chamber to be coated, or out of the deposition chamber after the deposition. The operation of the entire system can be controlled by control means 300.

To ensure a high level of decomposition of the stable dimer vapors, it is preferred that the dimer vapor be sufficiently heated in decomposition chamber 30. This can be accomplished either by increasing the surface area of cylinder 32 in decomposition chamber 30 in contact with the vaporized dimer, or by extending the residence time of the vaporized dimer in decomposition chamber 30, or by a combination of both. Typically, the residence time of the vaporized dimer in the decomposition chamber is 1–5 minutes. These operations also can all be controlled by control means 300. To enhance decomposition of the dimer to reactive monomer, a plasma may be established in the deposition chamber to provide sufficient heat to decompose any stable precursor material into reactive material for subsequent deposition and polymerization on a substrate.

Figure 3:
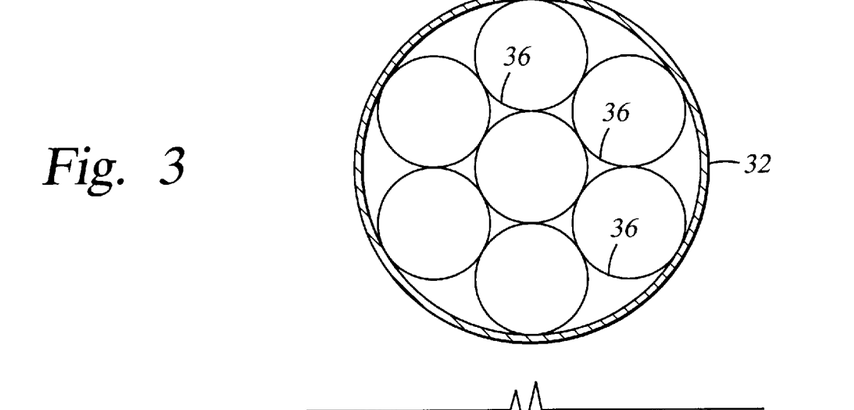
FIG. 3 is a horizontal cross-sectional view of the decomposition chamber of FIGS. 1 and 2, showing the hollow tubes placed within the decomposition chamber to increase the surface area in contact with the vapors and gases passing through the chamber.

Referring now to FIG. 3, a cross-sectional view of the preferred decomposition apparatus of FIG. 2, shows that metal cylinder 32 has been loaded or packed with a series of hollow tubes 36, each having its axis parallel to the center axis of metal cylinder 32. Tubes 36 are packed sufficiently tightly within cylinder 32 so as to be in thermal communication with one another so that each tube 36 is at the temperature of the wall of cylinder 32. The presence of tubes 36 within cylinder 32 therefore serve to greatly increase the surface area within cylinder 32 in contact with the vaporized monomer. Thus, the vaporized dimer is channeled through or in between tubes 36 so that the vaporized dimer is uniformly heated to the decomposition temperature, thus maximizing the amount of the dimer decomposed to the reactive monomer. Preferably, each hollow tube 36 is made of quartz, or at least has quartz surfaces thereon. Preferably when the inner diameter (ID) of cylinder 32 ranges from about 1.5 to about 2 inches, small tubes 36 will each have an outer diameter (OD) of from about 0.3 to about 0.5 inches, and a wall thickness of about 0.050 inches, resulting in an ID of from about 0.2 to about 0.4 inches.

As an alternative or supplement, as mentioned above, the residence time of the vaporized dimer within decomposition chamber 30 may also be increased. Extension of the residence time in the decomposition chamber may be provided by regulating the flow rate of vaporized dimer into decomposition chamber 30, such as by regulating the flow of carrier gas into vaporization chamber 10; or by throttling gate valves 20 and 40; or by a combination of such valve throttling and carrier gas flow rate control, under the control of control means 300. The residence time can also be controlled by the length of decomposition chamber 30, i.e., by lengthening metal cylinder 32, and/or by increasing the mean path length within cylinder 32 by the placement of flow redirecting elements within cylinder 32, as will be described below.

Figure 4:
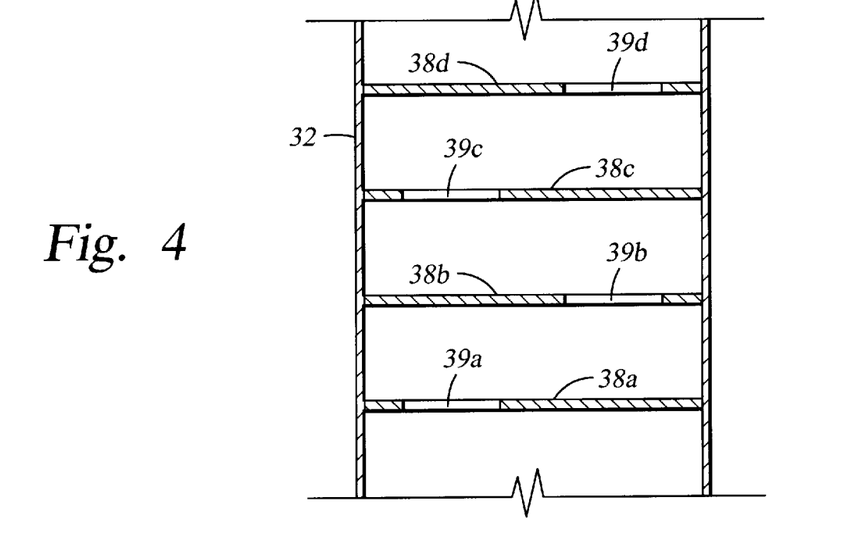
FIG. 4 is a vertical cross-sectional view of an alternate structure for the decomposition chamber of FIGS. 1 and 2, using a series of discs with non-aligned holes therein.
Figure 5:
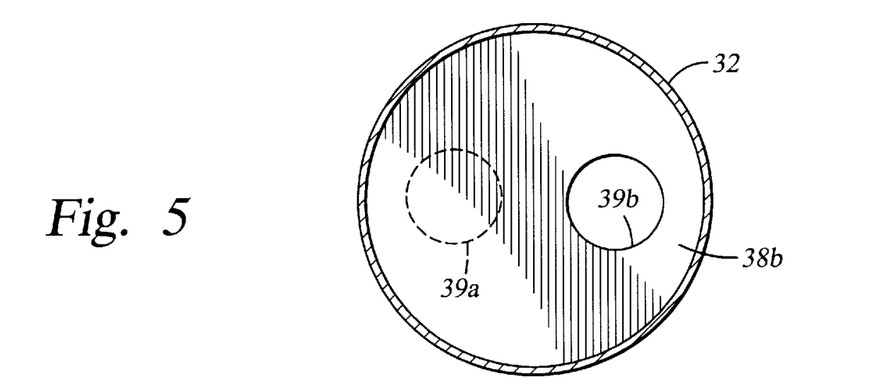
FIG. 5 is a top view of one of the discs shown in FIG. 4, showing the misalignment of the opening therein with the opening of an underlying disc.

Referring now to FIGS. 4 and 5, another embodiment of a decomposition chamber is shown comprised of a series of circular discs 38a–d placed in spaced apart relationship in cylinder 32, with the plane of each disc perpendicular to the center axis of cylinder 32. Each disc is provided with an opening through which the carrier gas/vaporized dimer mixture flows. However, as best seen in FIG. 4, openings in adjacent discs are deliberately misaligned to extend the length of travel of the gaseous mixture through cylinder 32.

Thus, opening 39b in disc 38b shown in FIG. 4 is axially misaligned to the underlying opening 39a in disc 38a beneath disc 38b. This embodiment actually acts to both increase the residence time (by increasing the length of the path of flow), and also to increase the contact area within cylinder 32 which comes in contact with the gaseous mixture, since the surface of each disc 38a–d, which will be at the same temperature as cylinder 32, will also be in contact with the gaseous mixture. As further shown in FIGS. 1 and 2, the gases flowing from decomposition chamber 30 pass into a metal tee 44, wherein the reactive monomer gases may be optionally blended with other copolymerizable materials, i.e., monomers or dimers with which the reactive parylene monomers will react and polymerize in the deposition chamber, as will be described below. A second flange 32b on the opposite end of cylinder 32 is connected to a first flange 42a of tee 44 to provide the connection between decomposition chamber 30 and tee 44. A second flange 42b of tee 44 is secured to a first flange 40a on second gate valve 40, which is operated by control mechanism 41 to control the flow of vapors into deposition chamber 60, as will be described below.

Third flange 42c of tee 44 is either secured to a flange (not shown) of conduit 46 (shown in FIG. 1) leading to a vaporized source of a copolymer to be mixed in tee 44, with the vaporized parylene monomer or, as shown in FIG. 2, a cap or cover 47 may be secured to flange 42c when no separate source of copolymer vapors are mixed with the reactive monomer from the decomposition chamber.

Tee 44, like flanged metal conduit 26, is preferably heated by an external heater such as heating tape wrapped around tee 44 to maintain the reactive monomer at a temperature sufficiently high so that it will not begin to polymerize. Usually this will comprise a temperature of at least about 150° C. When a copolymerizable source is used, a second vaporization chamber, similar to the previously described vaporization chamber 10, can be used to vaporize the copolymerizable material. If necessary, further apparatus forming a decomposition chamber similar to previously described decomposition chamber 30 may also be used. In either case, the apparatus used to provide such a copolymerizable material in gaseous form may then be connected to flange 42c of tee 44 to thereby permit the respective gaseous reactive copolymerization sources to blend together in tee 44 prior to introduction into deposition chamber 60.

In a further embodiment, other polymerizable gases, such as monomers, dimers, and other oligimers, etc., may be blended with the gaseous parylene monomer in heated tee 44 if it is desired to form and deposit a copolymer on the surface of the substrate in the deposition chamber. Such other polymerizable materials might include, for example, a vinyl biphenyl monomer, such as available from the Lancaster Synthesis Company. One reason for copolymerizing the reactive parylene monomer with such a monomer is to increase the temperature stability of the film to be formed on the substrate during the deposition from about 400° C. (polymerized parylene alone) up to between about 500° C. and 550° C. for the copolymer. The amount of copolymerized monomer blended with the gaseous flow of parylene reactive monomer and carrier gas may range from about 5% by wt. to about 25% by wt. of the total mixture of monomers, but preferably will range from about 5% by wt. to about 15% by wt., with the typical amount of copolymerizable monomer added usually comprising about 10% by wt. of the monomer mixture total.

Referring again to FIGS. 1 and 2, tee 44 is connected to second gate valve 40, through flanges 42b and 40a, and second gate valve 40 is connected to a further heated conduit 48 through flange 40*b* on gate valve 40 and flange 48*a* on conduit 48. As described above, with respect to conduit 26 and tee 44, conduit 48 is preferably heated, for example by heating tape, to avoid condensation therein. Heated conduit 48 is, in turn, connected via flange 48*b* to entrance port 50 of processing chamber 60.

Processing chamber 60, which in the deposition of parylene therein may be referred to as a vapor deposition chamber, may comprise a standard commercially available vacuum processing chamber, with some modifications as will be described below. Such a vacuum processing chamber is available from Applied Materials, Inc., such as an oxide etch chamber, which may be connected, via a load lock mechanism to other vacuum or closed chambers in a semiconductor substrate processing apparatus, such as the multi-chambered 5000 Series processing apparatus available from Applied Materials, Inc., without exposing the substrate to the atmosphere. Such an apparatus is disclosed and described in Maydan et al. U.S. Pat. No. 4,951,601, the disclosure of which is hereby incorporated by reference.

Processing chamber 60 has a removable cover 52 having entrance port 50 thereon to which conduit 48 is secured. Cover 52 is, in turn, bolted to the cylindrical sidewall 62 of chamber 60. Mounted to the underside or inside portion of cover 52 and in communication with conduit 42 is a vapor distribution mechanism or "showerhead" 160 which will be described in more detail below. Showerhead 160 serves to introduce the gaseous mixture from conduit 48 into chamber 60. Cover 52 may have heater pads 54 mounted on the upper or outer surface thereof to maintain cover 52 and showerhead 160 mounted thereto at a temperature above the polymerization temperature of the reactive parylene monomer, i.e., at a temperature above 200° C., but below a temperature at which further decomposition of the reactive monomer might occur, i.e., at a temperature below about 750° C. Typically, the temperature of cover 52 and showerhead 160 will be maintained within a range of from about 200° C. and about 300° C. Such heater pads may also be connected to a temperature controller to maintain the temperature of cover 52 and showerhead 160 at the desired temperature.

Figure 6:
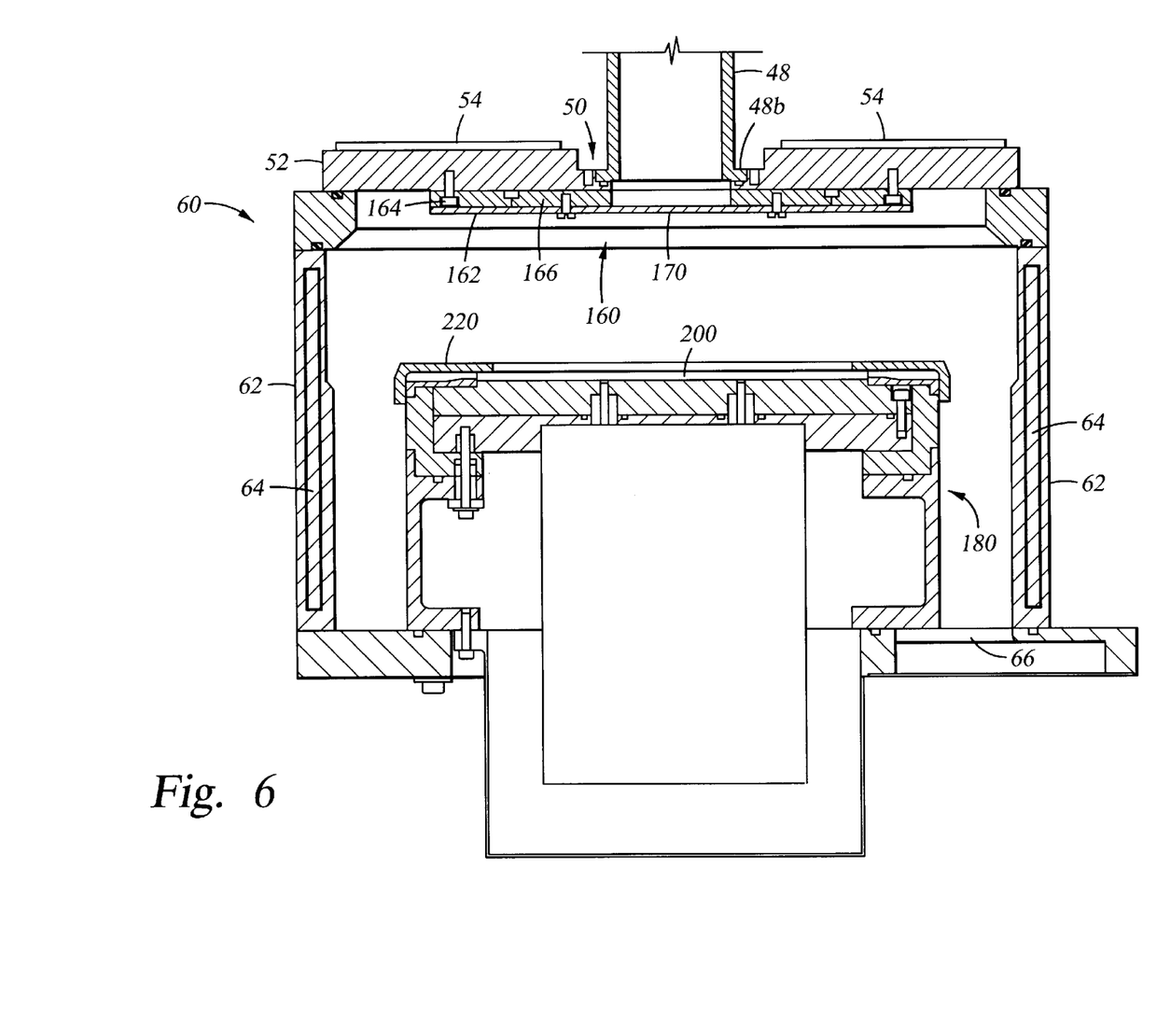
FIG. 6 is a vertical cross-sectional view of the processing chamber generally shown in FIG. 1.

Now referring to FIG. 6, one embodiment of a deposition chamber 60 is shown having a cylindrical sidewall 62 provided with a hollow passageway 64 through which fluid may be circulated to control the sidewall temperature of chamber 60. In accordance with the invention, a heating fluid is circulated through passageway 64 from heater 70 to maintain sidewall 62 at a temperature above about 100° C. to prevent or inhibit deposition of the reactive monomer, or polymerized reaction products of such monomer, on sidewall 62 of chamber 60. Also located in chamber 60 is an exit port 66 through which remaining vapors and carrier gases pass out of chamber 60 for optional processing as will be described below.

Figure 7:
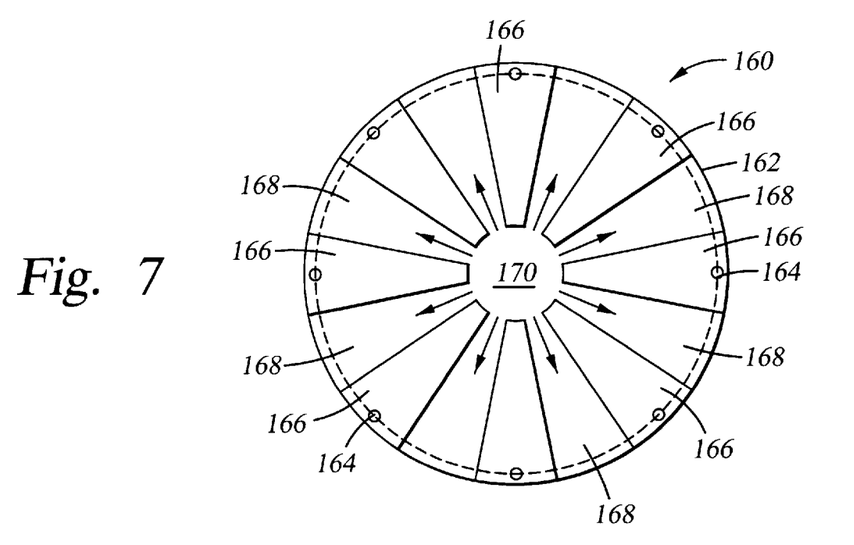
FIG. 7 is a top view of the vapor distribution mechanism or showerhead shown in FIG. 6.
Figure 8:
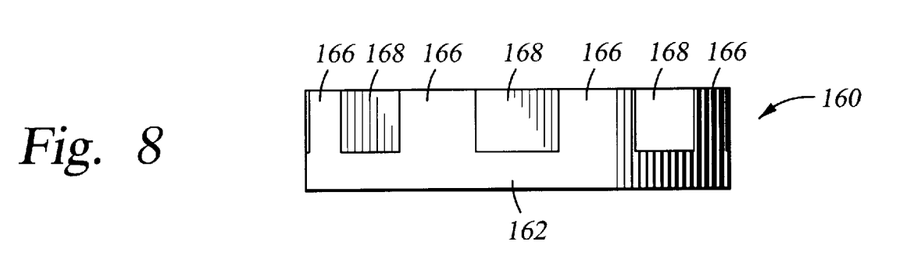
FIG. 8 is a vertical side view of the vapor distribution mechanism shown in FIG. 7.

The vapors/gases provided to deposition chamber 60 may be distributed through a variety of manifold and nozzle arrangements. According to one embodiment, showerhead 160, shown in FIGS. 6–8, comprises a circular plate 162 secured to cover 52 by bolts 164. Circular plate 162 is provided with a series of spaced apart wedge-shaped members 166 on the surface of plate 162 secured to cover 52 to thereby define therebetween a series of radial passageways 168 from the center of plate 162. Each wedge shaped member 166 terminates at a point spaced from the center of circular plate 162, thereby defining, with cover 52, a central plenum 170 connected to each of the radial passageways 168. The vapors and gases, as they enter chamber 60 through entrance port 50, flow into central plenum 170, then flow into radial passageways 168 between wedge-shaped members 166, as shown by the arrows in FIG. 7, to then emerge from the side of showerhead 160.

Figure 9:
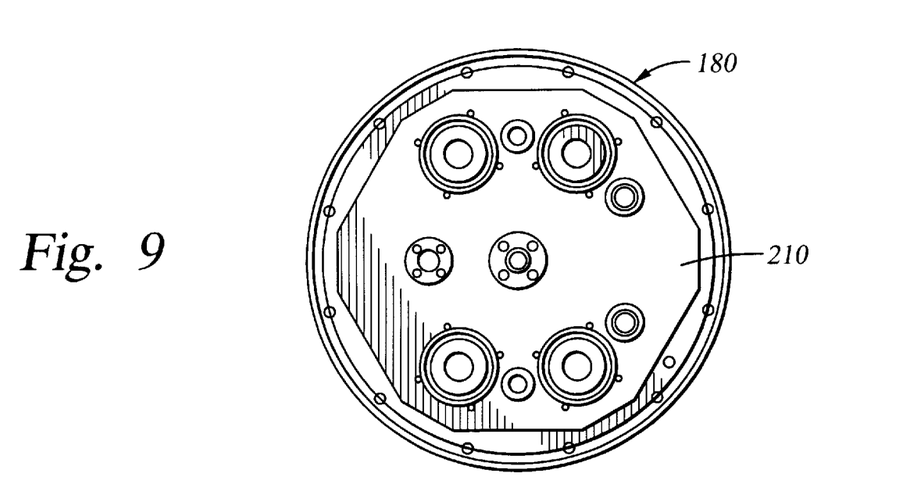
FIG. 9 is a top view of the wafer support mechanism of FIG. 6.

Referring now to substrate support member 180 shown in FIGS. 6 and 9, the movable substrate support member should be sufficiently cooled to obtain a substrate temperature below the condensation temperature of the polymerizable material. Where the desired polymer to be formed on the substrate is parylene, the substrate support 180 should be maintained at a temperature not exceeding about 40° C., and preferably within a range of from about −40° C. to about +25° C., using chiller 184, under control of chiller controller 181. When the gaseous mixture contacts the cooled surface of, for example, semiconductor substrate 200, polymerization of the reactive parylene monomers commences, as well as copolymerization with other reactive polymerizable materials (if present) resulting in the formation of the desired dielectric film of parylene or parylene copolymer on the surface of the substrate, e.g., on the surface of semiconductor wafer 200.

A temperature control system may be provided to cool substrate support 180, or support 180 may be provided with a hollow passageway through which a fluid may be circulated, for example, from chiller 100, under control of chiller controller 101, to control the temperature of substrate support 180 and a substrate mounted thereon, such as semiconductor wafer 200 shown in FIG. 6 mounted on the upper surface of substrate support 180. The substrate may be retained on substrate support 180 by any conventional substrate retention means such as a bipolar or monopolar electrostatic chuck 210, portions of which are shown in FIG. 9, or by clamping means 220, as shown in FIG. 6. A backside gas such as helium is preferably flown through channels provided in the upper surface of the electrostatic chuck to facilitate heat transfer between the substrate support member and a substrate located thereon for processing.

A plasma may be generated in the deposition chamber once the substrate has been positioned for processing to initially heat the substrate and prevent condensation of water on the surface of the substrate which may adversely affect the repeatability of film layer deposition. Preferably, under processing conditions the substrates will be introduced into the deposition chamber through a load lock and condensation will not occur on the substrate surface. However, in the event that condensation does occur, a plasma or other heating means may be employed to prevent this occurrence. Typically, the substrate may be heated initially to a temperature in the range of 80° C. to 120° C. to prevent condensation of water on the substrate surface when the substrate is subsequently cooled so that the reactive material will condense thereon and polymerize.

The substrate support member is movable within the chamber to position a substrate in close relationship to the gas distribution plate. It is believed that decreased spacing between the gas distribution plate and the substrate support member results in an increased deposition rate of thin parylene films. Movable substrate support members are available from Applied Materials, Inc., Santa Clara, Calif.

A clamp ring 220 or other shielding means are preferably provided to prevent deposition of the polymerizable material onto the backside of the substrate. Preferably, the clamp ring 220 is positioned on a shield or hanger disposed in the chamber and is lifted off the shield by the substrate support member as the support member is moved through the clamp ring. Clamp rings are available from Applied Materials, Inc., Santa Clara, Calif. Other means to prevent backside deposition of polymerizable material onto the substrate may include a purge gas system which provides a purge gas to the backside of the substrate to prevent deposition of the reactive materials onto the edge and backside of the substrate.

Now referring to Figure, after the mixture of vaporized gases and optional carrier gases flow into chamber 60 a parylene polymer, for example, is deposited on the surface of substrate 200 by condensation and polymerization of the reactive parylene monomers. The remainder of the optional carrier gases, and unreacted monomer vapors, then pass out of chamber 60 through an exit port 66 (see FIG. 10) and then through a throttle valve 80 to a cold trap 90. The purpose of throttle valve 80 is to maintain the desired pressure within chamber 60. The deposition/polymerization reaction is usually carried out while maintaining a pressure within deposition chamber 60 of from about 30 milliTorr (mTorr) to about 1 Torr. A pressure lower than about 30 mTorr will result in little or no deposition of the parylene on the substrate, while too high a pressure, i.e., a pressure above about 1 Torr, will result in deposition of a low crystalline film, including unreacted polymer. When the pressure in deposition chamber 60 deviates from the set pressure, throttle valve 80, which is connected to a pressure sensor, either opens to cause the pressure to drop, or closes to cause the pressure to rise.

Figure 10:
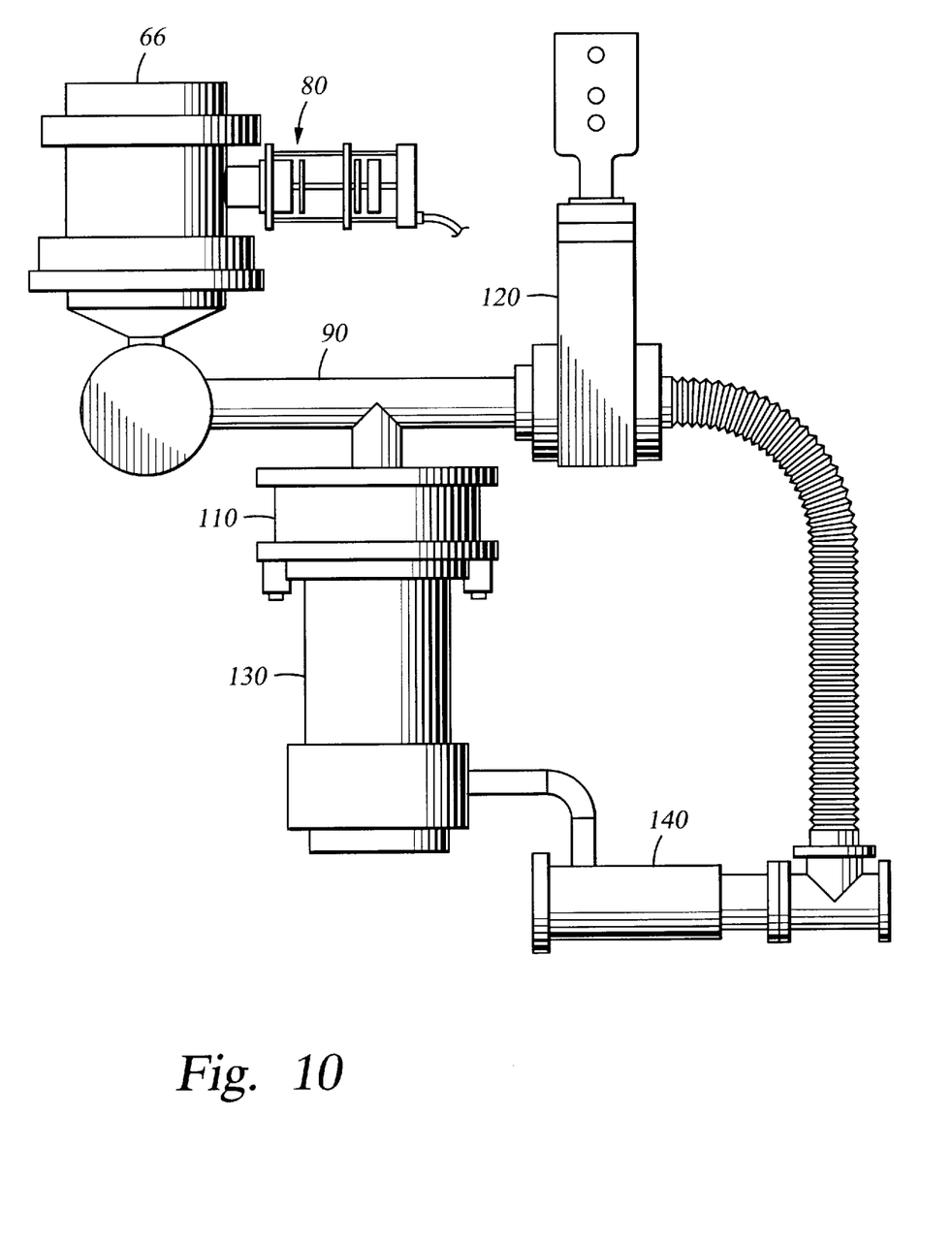
FIG. 10 is a vertical cross-sectional view of a portion of the apparatus generally shown in FIG. 1, showing the processing of gases/vapors exiting from the processing chamber.
Figure 11:
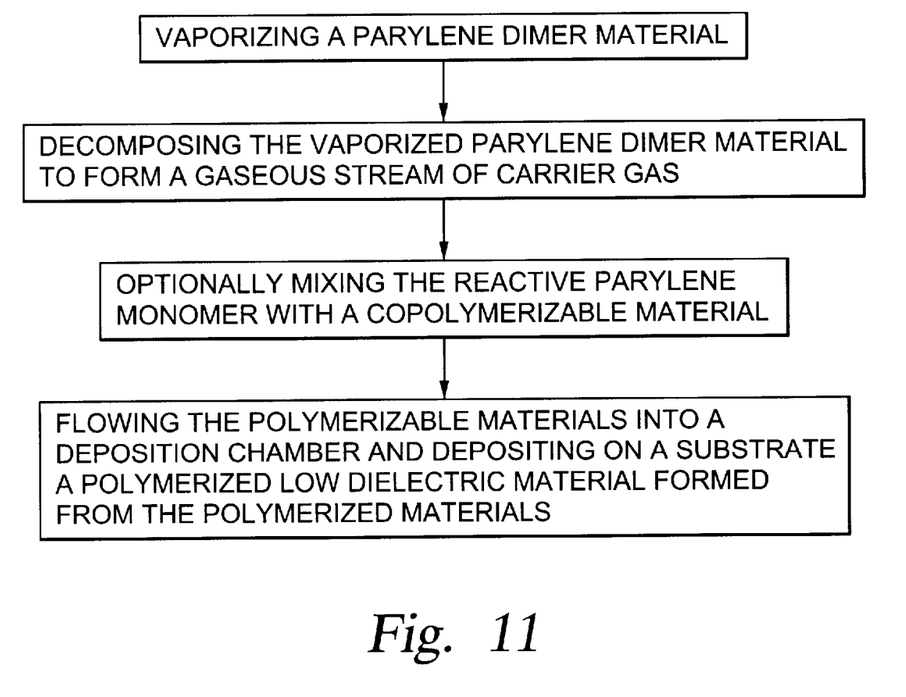
FIG. 11 is a flow sheet illustrating a process according to one embodiment of the present invention.

Now referring to FIG. 10, throttle valve 80 may be modified, if desired, to permit a non-reactive gas, e.g., argon, helium, or nitrogen, to be added to the gaseous stream flowing from chamber 60 through throttle valve 80 to cold trap 90. Typically, this additional gas flow into cold trap 90 will comprise a flow of about 50 standard cubic centimeters per minute (sccm), depending on the chamber volume. This flow will also be under the control of controller 300. The purpose of the added non-reactive gases is to control and slow down the flow of the gaseous stream of carrier gas and reactive monomer through deposition chamber 60, i.e., to increase the residence time, to permit more complete extraction of the heat from the gaseous stream flowing through chamber 60 and to provide for more complete reaction of the polymerization, i.e., to further minimize the amount of unreacted polymerizable material leaving chamber 60 via exit port 66 which must be extracted in cold trap 90.

The vapors and gases passing through throttle valve 80 then enter cold trap 90 which, in turn, is connected to a vacuum pump 150 (see FIG. 1) which is capable of maintaining chamber 60 at subatmospheric pressure. It is important, however, that unreacted parylene and other copolymerizable materials not enter vacuum pump 150, but rather be removed from the gas stream in cold trap 90. Cold trap 90 may comprise any conventional commercial cold trap, such as, for example, a standard Norcal cold trap, which is connected to the downstream side of throttle valve 80 to trap and remove any such vapors or solids of parylene and other copolymerizable materials from the gas stream.

Connected to the downstream side of cold trap 90 is gate valve 120 through which the remaining gases in the gas stream pass to rough vacuum pump 150 to maintain the desired low pressure. As shown in FIGS. 1 and 10, cold trap 90 is also connected through gate valve 110 to a turbo pump 130 and then through an isolation valve 140 to rough vacuum pump 150. When chamber 60 is used as a deposition chamber, such as for the previously discussed polymeric deposition of reactive parylene monomer, valves 110 and 140 are shut and valve 120 is opened to connect rough vacuum pump directly to cold trap 90. However, if the same chamber is to be used as a plasma etch chamber or for any other processing requiring high vacuum, such as for in situ plasma cleaning of the chamber, as previously discussed, gate valve 120 may be shut off and both gate valve 1 10 and isolation valve 140 opened to place high vacuum turbo pump 130 in the stream between cold trap 90 and rough vacuum pump 150.

To clean the chamber following deposition of reactive monomer, ozone is flown into the chamber at a rate of 1000 sccm. It is believed that the reactive ozone reacts with the parylene to facilitate removal of the parylene from the chamber. In addition to ozone, oxygen can be flown into the chamber at a rate of 100–1000 sccm and an RF bias of 750–1200 watts applied to the support member to effectuate cleaning of the chamber. It is believed that the oxygen reacts with the parylene in a manner similar to the reaction of ozone with parylene.

EXAMPLE 1

To further illustrate the process of the invention, using the apparatus of the invention, an eight inch diameter silicon wafer was mounted on a substrate support maintained at a temperature of about 10° C. in the deposition chamber. Three to four grams of particulate parylene dimer were loaded into the vaporization chamber and the chamber was then heated to 150° C. After about 5 minutes of heating, the temperatures throughout the apparatus reached equilibrium and the gate valve separating the vaporization chamber from the decomposition chamber was opened and the vapors of parylene dimer were allowed to flow into the decomposition chamber which was preheated to a temperature of 600° C. The exit gate valve of the decomposition chamber was then opened and the vaporized reactive parylene monomer formed in the decomposition chamber then flowed from the decomposition chamber through the heated conduit to the deposition chamber. The lid of the deposition chamber was maintained at a temperature of about 150° C., and the walls of the chamber were maintained at about 100° C. About 50 sccm of nitrogen was flown into the cold trap during the deposition and the flapper valve was set to maintain a pressure of about 50 mTorr in the deposition chamber. The reactive parylene monomer vapors contacted the cooled silicon wafer and polymerized thereon. After about 15 minutes, the flow of reactive monomer vapors was shut off by first shutting the gate valve between the vaporization chamber and the decomposition chamber, and then, after pumping out the decomposition chamber to remove all parylene monomer vapors from that chamber, shutting off the gate valve between the decomposition chamber and the deposition chamber. The wafer was then removed from the chamber, after being allowed to warm to ambient temperature, and examined. About 5000 Angstroms of a parylene polymer film was found to have formed over the wafer. The dielectric constant of the film was tested and found to be 2.7.

Thus, the invention comprises apparatus and process for forming a low dielectric constant film on a semiconductor substrate comprising parylene or a copolymer formed using reactive parylene monomer and a second copolymerizable material.

What is claimed is:

1. An apparatus for forming a thin polymer layer on the surface of an object, comprising:

a vaporization chamber adapted to vaporize a polymerizable material into a carrier gas stream; and a deposition chamber in fluid communication with the vaporization chamber and adapted to receive the carrier gas and vaporized polymerizable material, the deposition chamber having:

a support member adapted to receive an object;

a chiller adapted to cool the object below the condensation temperature of the polymerizable material;

a heater adapted to maintain one or more walls of the deposition chamber at a temperature above the polymerization temperature of the polymerizable material; and a magnet assembly adapted to provide a B field to enhance the deposition rate of the polymerizable material onto the object.

2. The apparatus of claim 1 further comprising:

a vacuum pump in fluid communication with the deposition chamber and adapted to withdraw the carrier gas containing unused polymerizable material;

a separator adapted to separate the unused polymerizable material from the carrier gas disposed between the deposition chamber and the vacuum pump; and a processor adapted to control the vaporizer and the vacuum pump.

3. The apparatus of claim 1 wherein the chiller cools the substrate support member.

4. The apparatus of claim 1 wherein the polymerizable material is a dimer, the apparatus further comprising:

a decomposition chamber adapted to decompose the vaporized dimer material to form a vaporized reactive monomer.

5. The apparatus of claim 4 wherein the polymerizable material is a para-xylylene dimer and the vaporized reactive monomer is para-xylylene.

6. The apparatus of claim 5 further comprising:

a second vaporization chamber adapted to vaporize a copolymerizable material into a carrier gas, wherein the second vaporization chamber is in fluid communication with the deposition chamber.

7. The apparatus of claim 6 wherein the chiller provides a temperature sufficient to co-polymerize the vaporized reactive monomer and the copolymerizable material.

8. The apparatus of claim 1 wherein the vaporized polymerizable material comprises at least two monomers.

9. The apparatus of claim 5 wherein the vaporization chamber includes a heater adapted to increase the temperature of the parylene dimer to between about 100° C. and about 250° C.

10. The apparatus of claim 1 further comprising:

a carrier gas supply connected to the vaporization chamber.

11. The apparatus of claim 5 wherein the decomposition chamber comprises a heater adapted to increase the temperature of the vaporized parylene dimer to a temperature between about 400° C. and about 750° C.

12. The apparatus of claim 4 wherein said decomposition chamber includes a quartz liner.

13. The apparatus of claim 1 wherein said deposition chamber further includes a top wall, side walls and a gas distribution system disposed through the top wall, the gas distribution system adapted to deliver the gas stream into said chamber.

14. The apparatus of claim 13 wherein the substrate support member comprises a passageway therein adapted to circulate a cooling fluid to maintain the substrate at a sufficiently low temperature that polymerizable material will condense onto the substrate and polymerize.

15. The apparatus of claim 13 wherein said heater maintains the top wall, side walls and gas distribution system at a temperature above the polymerization temperature of polymerizable material.

16. The apparatus of claim 15 wherein the heater comprises a passage through a side wall for circulating a heating fluid.

17. The apparatus of claim 2 wherein the separator comprises a cold trap.

18. The apparatus of claim 17 wherein said cold trap comprises a port connected to an additional source of gas.

19. The apparatus of claim 2 further comprising an apparatus adapted to provide a plasma in the chamber and an exhaust system to circulate gases from the deposition chamber through a turbo pump before entering a roughing pump.

20. A process of forming a thin polymer layer on the surface of an object, comprising:

positioning an object within a deposition chamber;

vaporizing a polymerizable material into a carrier gas stream;

maintaining one or more walls of the deposition chamber at a temperature above the polymerization temperature of the polymerizable material;

maintaining the object at a temperature below the condensation temperature of the polymerizable material, flowing the vaporized polymerizable material and the carrier gas stream into the deposition chamber; maintaining a B field within the deposition chamber; and depositing a thin polymer layer onto the object.

21. The process of claim 20 further comprising:

maintaining a gas distribution system contained in the deposition chamber at a sufficiently high temperature so that the polymerizable material will not deposit or form a polymer thereon.

22. The process of claim 21 further comprising:

circulating a heating fluid through a passage in a sidewall of the deposition chamber to heat the sidewall of the deposition chamber.

23. The process of claim 20 wherein the process comprises:

circulating a cooling fluid through a passageway in a support member.

24. The process of claim 20 wherein the step of vaporizing the polymerizable material is performed in a vaporization chamber, and wherein the process further comprises:

flowing the carrier gas stream into the vaporization chamber.

25. The process of claim 20 further comprising:

withdrawing the carrier gas and any unused vaporized polymerizable material remaining in the carrier gas stream from the deposition chamber; and separating the unused polymerizable material from the carrier gas stream.

26. The process of claim 25 wherein the unused and withdrawn polymerizable material is separated from the carrier gas by passage through a cold trap, and wherein the process further comprises:

controlling the pressure in the deposition chamber with a pressure control valve disposed between the deposition chamber and the cold trap.

27. The process of claim 24 wherein the polymerizable material is a dimer, and wherein the process further comprises:

decomposing the vaporized dimer to form a vaporized reactive monomer.

28. The process of claim 27 wherein the dimer is a parylene dimer and the vaporized reactive monomer is para-xylylene.

29. The process of claim 24 further comprising:

heating the vaporization chamber to a temperature between about 100° C. and about 750° C.

30. The process of claim 27 further comprising:

heating the decomposition chamber to a temperature between about 400° C. and about 750° C.

31. An apparatus for forming a thin polymer layer on the surface of an object, comprising:

a processing chamber having a sidewall and a lid;

a substrate support member disposed in the lower portion of the chamber;

a gas inlet adapted to provide reactive monomer into the chamber;

a chiller adapted to cool the substrate support member; a magnet assembly adapted to provide a B field to enhance the deposition rate of the polymerizable material onto the object and a heater adapted to heat the sidewall of the processing chamber;

wherein the sidewall of the processing chamber is maintainable at a temperature to prevent condensation of the reactive monomer thereon and the substrate support member is maintainable at a temperature to allow condensation of the reactive monomer thereon.

32. The apparatus of claim 31 further comprising a vaporization chamber adapted to vaporize a polymerizable material into a carrier gas stream.

33. The apparatus of claim 32 wherein the polymerizable material is a dimer, the apparatus further comprising:

a decomposition chamber adapted to decompose the vaporized dimer material to form a vaporized reactive monomer.

34. The apparatus of claim 33 further comprising:

a second vaporization chamber adapted to vaporize a copolymerizable material into a carrier gas, wherein the second vaporization chamber is in fluid communication with the processing chamber.

35. The apparatus of claim 34 wherein the vaporization chamber includes a heater to increase the temperature of the dimer to between about a 100° C. and about 250° C.

36. The apparatus of claim 32 further comprising:

a carrier gas supply connected to the vaporization chamber.

37. The apparatus of claim 34 further comprising a showerhead disposed in the chamber to provide reactive monomer from the inlet into the chamber.

38. The apparatus of claim 1 further comprising an electric bias to generate an E field to enhance the deposition rate of the polymerizable material onto the object.

39. The apparatus of claim 1 wherein the support member is movable within the chamber to position the object to be processed in the chamber.

40. An apparatus for forming a thin polymer layer on the surface of an object, comprising:

a vaporization chamber adapted to vaporize a polymerizable material into a carrier gas stream; and a deposition chamber in fluid communication with the vaporization chamber and adapted to receive the carrier gas and vaporized polymerizable material, the deposition chamber having:

a support member adapted to receive an object;

a chiller adapted to cool the object below the condensation temperature of the polymerizable material so that a thin layer of the polymerizable material is deposited on the object and allowed to form a polymer layer; and a magnet assembly adapted to provide a B field.

41. The apparatus of claim 40 further comprising an electric bias to generate an E field to enhance the deposition rate of the polymerizable material onto the object.

42. An apparatus for forming a thin polymer layer on the surface of an object, comprising:

a first vaporization chamber adapted to vaporize a first polymerizable material into a first carrier gas stream; and a second vaporization chamber adapted to vaporize a second polymerizable material into a second carrier gas stream;

a deposition chamber in fluid communication with the first and second vaporization chambers and adapted to receive the first and second vaporized polymerizable material, the deposition chamber having:

a support member adapted to receive an object; and a chiller adapted to cool the object below the condensation temperature of the first and second polymerizable materials; and a magnet assembly adapted to provide a B field to enhance the deposition rate of the polymerizable material onto the object.

43. The apparatus of claim 42, further comprising:

a heater adapted to maintain one or more walls of the deposition chamber at a temperature above the polymerization temperature of the first and second polymerizable material.

* * * * *

UNITED STATES PATENT AND TRADEMARK OFFICE
CERTIFICATE OF CORRECTION

PATENT NO. : 5,958,510
DATED : September 28, 1999
INVENTOR(S) : Sivaramakrishnan et al.

It is certified that error appears in the above-identified patent and that said Letters Patent is hereby corrected as shown below:

Column 13,
Line 6, after "Figure", please insert "6".

Signed and Sealed this

Twenty-third Day of October, 2001

*Attest:*

NICHOLAS P. GODICI
*Attesting Officer*    *Acting Director of the United States Patent and Trademark Office*